United States Patent
Kim et al.

(10) Patent No.: US 8,120,006 B2
(45) Date of Patent: Feb. 21, 2012

(54) NON-VOLATILE MEMORY DEVICE

(75) Inventors: Suk-pil Kim, Yongin-si (KR); June-mo Koo, Seoul (KR); Tae-eung Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 174 days.

(21) Appl. No.: 12/585,582

(22) Filed: Sep. 18, 2009

(65) Prior Publication Data

US 2010/0072452 A1   Mar. 25, 2010

(30) Foreign Application Priority Data

Sep. 19, 2008   (KR) ................ 10-2008-0092415

(51) Int. Cl.
*H01L 47/00*   (2006.01)
*H01L 27/108*  (2006.01)
*H01L 29/76*   (2006.01)
*H01L 29/94*   (2006.01)
*H01L 31/119*  (2006.01)

(52) U.S. Cl. ............ 257/4; 257/296; 257/303; 257/300

(58) Field of Classification Search ............. 257/4, 296, 257/297, 313, 312, 311, 310, 298–309, 533, 257/595, 596, 597–602, 923, 924
See application file for complete search history.

(56) References Cited

U.S. PATENT DOCUMENTS

2008/0210926 A1* 9/2008 Lowrey ............................. 257/5
2009/0261314 A1* 10/2009 Kim et al. ........................ 257/4

OTHER PUBLICATIONS

O. De Sagazan et al., "Micro-electro-mechanical systems fast fabrication by selective thick polysilicon growth in epitaxial reactor", Microsyst Technol, May 19, 2006, pp. 953-958.

* cited by examiner

*Primary Examiner* — Chuong A. Luu
(74) *Attorney, Agent, or Firm* — Harness, Dickey & Pierce, P.L.C.

(57) ABSTRACT

Provided is a non-volatile memory device having a stacked structure that is easily highly integrated and a method of economically fabricating the non-volatile memory device. The non-volatile memory device may include at least one first electrode and at least one second electrode that cross each other. At least one data storage layer may be disposed on a section where the at least one first electrode and the at least one second electrode cross each other. The at least one first electrode may include a first conductive layer and a first semiconductor layer.

20 Claims, 13 Drawing Sheets

NON-VOLATILE MEMORY DEVICE

CROSS-REFERENCE TO RELATED APPLICATIONS

This application claims priority under 35 USC §119 to Korean Patent Application No. 10-2008-0092415, filed on Sep. 19, 2008, in the Korean Intellectual Property Office (KIPO), the entire contents of which are incorporated herein by reference.

BACKGROUND

1. Field

Example embodiments relate to a semiconductor device, and more particularly, to a non-volatile memory device having a multi-layer structure and a method of fabricating the same.

2. Description of the Related Art

Although semiconductor products have been reduced in size, they are required to process high capacity data. Accordingly, increasing the operation speed and integration of a non-volatile memory device used in such semiconductor products may be required. From this point of view, highly integrating a non-volatile memory device having a multi-layer structure than a non-volatile memory device having a conventional single-layer structure may be easier.

By using a multi-layer structure, memory cells are perpendicularly stacked on the same area as in a single-layer structure. However, connecting and selecting memory cells in each layer in a non-volatile memory device having a multi-layer structure may not be easy. Also, as the number of stacked layer increases in the non-volatile memory device having a multi-layer structure, manufacturing costs may increase.

SUMMARY

Example embodiments provide a non-volatile memory device that has a stacked structure and may be easily highly integrated. Example embodiments also provide a method of economically fabricating the non-volatile memory device.

According to example embodiments, there is provided is a non-volatile memory device including at least one first electrode and at least one second electrode that cross each other. At least one data storage layer may be on a section where the at least one first electrode and the at least one second electrode cross each other. The at least one first electrode, the at least one data storage layer, and the at least one second electrode may form at least one diode.

The at least one first electrode may include at least one first conductive layer and at least one first semiconductor layer of a first conductive type, and the at least one second electrode may include at least one second semiconductor layer of a second conductive type opposite from the first conductive type. The at least one first conductive layer may be a metal layer, a metal silicide layer, or a multi-layer including a metal silicide layer and a metal layer.

The at least one first semiconductor layer may be between the at least one first conductive layer and the at least one data storage layer so that the at least one first conductive layer and the at least one data storage layer do not directly contact each other. The at least one first semiconductor layer may be between the at least one first conductive layer and the at least one data storage layer so as to cover a side surface of the at least one first conductive layer facing the at least one data storage layer. The at least one first semiconductor layer may have a first surface facing the at least one data storage layer, and a section of the first surface may form a convex arc. The at least one second electrode may include at least one pair of second electrodes on both sides of the at least one first electrode.

The at least one first electrode may have a first surface and a second surface facing the at least one pair of second electrodes, and the at least one data storage layer may include at least one pair of data storage layers formed on the first and second surfaces. The at least one pair of second electrodes may include a plurality of pairs of second electrodes along an extension direction of the at least one first electrode, and the at least one pair of data storage layers may include a plurality of pairs of data storage layers along the extension direction of the at least one first electrode.

The at least one first electrode may include a plurality of first electrodes in a plurality of layers. The at least one first electrode may include a plurality of first electrodes, the at least one second electrode may include a plurality of second electrodes, and the at least one diode may include the plurality of first electrodes, the plurality of data storage layers, and the plurality of second electrodes.

In example embodiments, the non-volatile memory device may further include at least one dielectric layer on exposed surfaces of the at least one first conductive layer and the at least one first semiconductor layer, wherein the at least one dielectric layer is made of a silicon oxide layer.

According to example embodiments, a card may include a controller; and a memory including the non-volatile memory device of example embodiments, wherein the controller and the memory are configured to exchange electric signals according to a command of the controller.

According to example embodiments, a system may include a processor, an input/output device, and a memory including the non-volatile memory device of example embodiments, wherein the processor, the input/output device, and the memory are configured to transmit or receive data to/from each other via a bus.

According to example embodiments, there is provided a method of fabricating a non-volatile memory device. At least one first electrode may be formed. At least one data storage layer may be formed to combine it with the at least one first electrode. At least one second electrode may be formed to cross the at least one first electrode, wherein the at least one data storage layer may be on a section where the at least one first electrode and the at least one second electrode cross each other.

Forming the at least one first electrode may include forming a third semiconductor layer of a first conductive type on a first conductive layer, and selectively extending the first semiconductor layer from a third semiconductor layer. Forming the at least one second electrode may include forming a second semiconductor layer of a second conductive type opposite of the first conductive type, wherein the at least one data storage layer may be disposed on a section where the first semiconductor layer having the first conductive type and the second semiconductor layer having the second conductive type cross each other.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Figure 1:
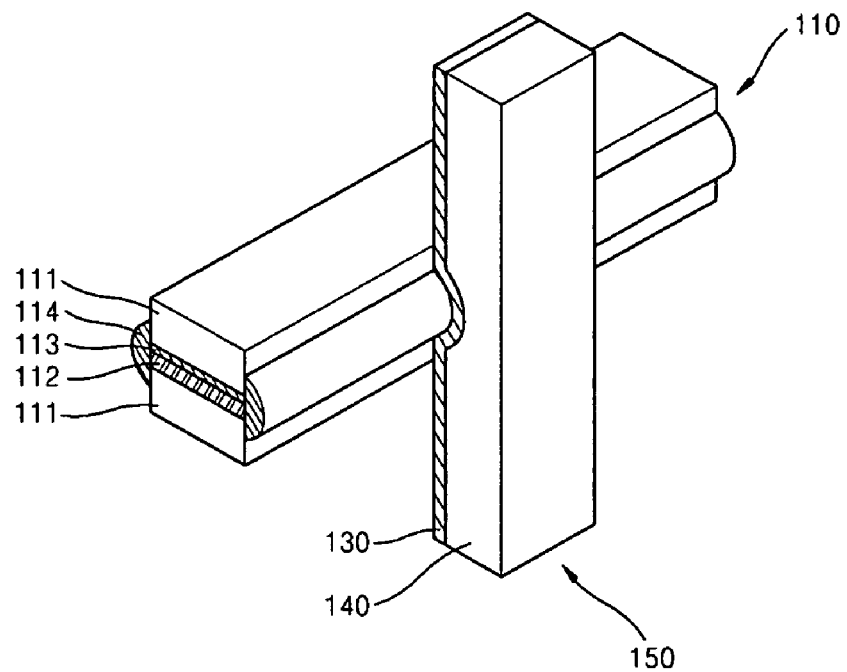
FIG. 1 is a perspective view illustrating a non-volatile memory device according to example embodiments.

Example embodiments will now be described with reference to accompanying drawings. Example embodiments may, however, be embodied in many different forms and should not be construed as being limited to example embodiments set forth herein; rather, these example embodiments are provided so that this disclosure will be thorough and complete, and will fully convey the inventive concept to those skilled in the art. In the drawings, sizes may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a non-volatile memory device according to example embodiments. Referring to FIG. 1, a first electrode 110 and a second electrode 150 may cross each other. For example, the first electrode 110 and the second electrode 150 may perpendicularly cross each other. However, the first electrode 110 and the second electrode 150 may cross each other at another angle. The second electrode 150 may contact a side wall of the first electrode 110.

The first electrode 110 may include a first conductive layer 112 and a first semiconductor layer 114 of a first conductive type. The first conductive layer 112 has a resistivity lower than that of the first semiconductor layer 114. For example, the first conductive layer 112 may be a metal layer or a metal silicide layer. The first conductive layer 112 may be a multi-layer wherein a metal layer and a metal silicide layer are sequentially stacked on each other.

The second electrode 150 may include a second semiconductor layer 140 of a second conductive type opposite to the first conductive type. The second electrode 150 may further include a second conductive layer (not shown) like the first electrode 110. The second conductive layer has a resistivity lower than that of the second semiconductor layer 140.

A data storage layer 130 may be disposed between the first electrode 110 and the second electrode 150. For example, the data storage layer 130 may be disposed on a section where the first semiconductor layer 114 of the first electrode 110 and the second semiconductor layer 140 of the second electrode 150 cross each other. However, the data storage layer 130 may be differently disposed, for example, as one layer between the first electrode 110 and the second electrode 150.

The data storage layer 130 may locally store a resistance change thereof, and may control a current flow between the first electrode 110 and the second electrode 150. For example, the data storage layer 130 may have a high resistance, low resistance, or insulator characteristic according to an applied voltage. Such a variable resistance characteristic of the data storage layer 130 may be used to store data in the non-volatile memory device.

For example, the data storage layer 130 may include a phase change resistance material, and in example embodiments, the non-volatile memory device may operate as a phase-change random access memory (PRAM). For example, the phase change resistance material may include a chalcogenide compound, e.g., GST (GeSbxTey). The phase change resistance material may have a high resistance state and a low resistance state according to a crystalline state.

Alternatively, the data storage layer 130 may include a variable resistance material, and in example embodiments, the non-volatile memory device may operate as a resistance random access memory (RRAM). The variable resistance material is classified from the phase change resistance material because a resistance value of the variable resistance material changes without changing a state of a material. However, the variable resistance material may also be a phase change resistance material. For example, the variable resistance material may include NiO, $Nb_2O_5$, or ZnO.

Alternatively, the data storage layer 130 may include a breakdown material. For example, the data storage layer 130 may include an insulating material (e.g., oxide) in which breakdown may occur according to a voltage applied to the data storage layer 130. The non-volatile memory device may be used as a one-time program (OTP) memory. Despite of its disadvantages, the OPT memory may be used in a product requiring high memory capacity. Because the breakdown material may not regain the insulating characteristic, the breakdown material may be referred to as a fuse. Because the conductivity of the phase change resistance material and/or the variable resistance material changes, they are referred to as an anti-fuse.

The first semiconductor layer 114 of the first electrode 110 may be disposed between the first conductive layer 112 and the data storage layer 130 so that the first conductive layer 112 and the data storage layer 130 do not directly contact each other. The first semiconductor layer 114 may be disposed between the first conductive layer 112 and the data storage layer 130 so as to cover a side of the first conductive layer 112 facing the data storage layer 130, and may have a first surface facing the data storage layer 130, wherein the section of the first surface may be a convex arc.

Alternatively, the first electrode 110 may further include a third semiconductor layer 113. The third semiconductor layer 113 may be formed on the first conductive layer 112 and may be of the first conductive type. The first semiconductor layer 114 may be disposed between the third semiconductor layer 113 and the data storage layer 130 and between the first conductive layer 112 and the data storage layer 130, so as to cover a side of the third semiconductor layer 113 facing the data storage layer 130 and a side of the first conductive layer 112 facing the data storage layer 130. The first semiconductor layer 114 has a first surface facing the data storage layer 130 and the section of the first surface may be a convex arc.

A dielectric layer 111 may be formed on the top and bottom of the first electrode 110 including the first conductive layer 112 and the first semiconductor layer 114. The dielectric layer 111 may be formed of a silicon oxide layer. The first electrode 110, the data storage layer 130, and the second electrode 150 may form a diode. The diode may rectify a current flow between the first electrode 110 and the second electrode 150. In other words, the current flow between the first electrode 110 and the second electrode 150 may flow in a direction according to the polarity of the diode.

The non-volatile memory device of FIG. 1 may form one memory cell. For example, the first electrode 110 may be a bit line and the second electrode 150 may be a word line, or the second electrode 150 may be a bit line and the first electrode 110 may be a word line. For example, the first conductive type may be an N type and the second conductive type may be a P type. Alternatively, the first conductive type may be a P type and the second conductive type may be an N type. Accordingly, the diode may have a PN diode structure.

A signal from the first electrode 110 may be transmitted to the second electrode 150 via the data storage layer 130. According to the non-volatile memory device according to example embodiments, the diode may form a PN diode having a P-dielectric layer-N junction structure, and may have a rectifying characteristic.

Figure 2:
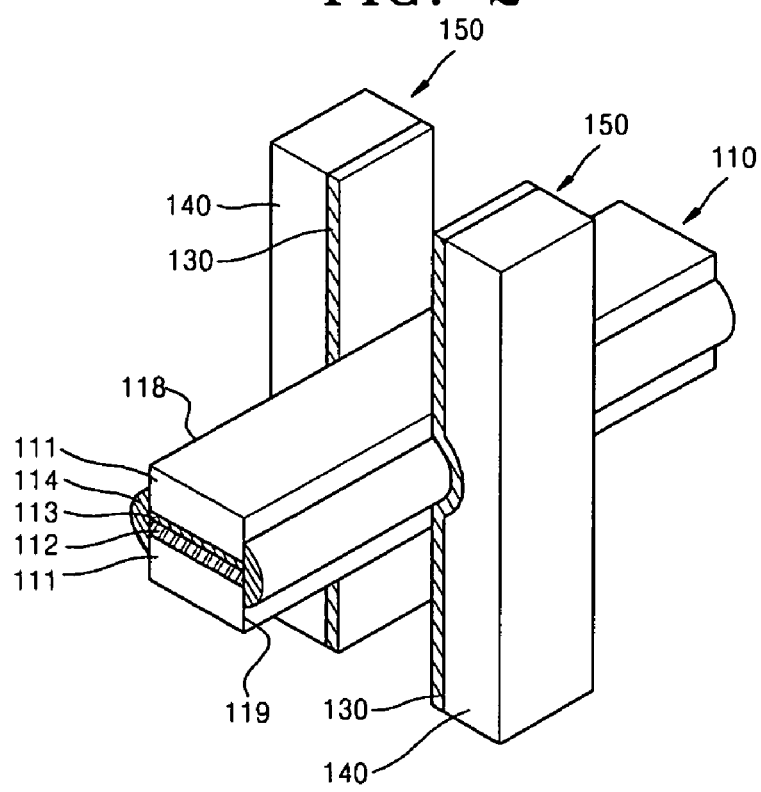
FIG. 2 is a perspective view illustrating a non-volatile memory device according to example embodiments.

FIG. 2 is a perspective view illustrating a non-volatile memory device according to example embodiments. The non-volatile memory device according to example embodiments illustrated in FIG. 2 may include more elements than the non-volatile memory device of FIG. 1, and descriptions of the same elements will be omitted.

Referring to FIG. 2, a pair of second electrodes 150 may be disposed on both sides of the first electrode 110. For example, the first electrode 110 may include a first surface 118 and a second surface 119 opposite to each other, and the second electrodes 150 are each disposed to face the first surface 118 and the second surface 119. The second electrodes 150 may be perpendicular to the first electrode 110, and/or be parallel to each other. However, locations of the second electrodes 150 and the first electrode 110 are not limited thereto. For example, the second electrodes 150 may cross the first electrode 110 and extend in different directions.

A pair of data storage layers 130 may be each disposed between the first electrode 110 and the second electrodes 150. A pair of diodes may be each disposed on the first surface 118 and the second surface 119. In other words, the first electrode 110, the data storage layer 130, and the second electrode 150 may form one diode in a direction of the first surface 118 of the first electrode 110, and the first electrode 110, the data storage layer 130, and the second electrode 150 may form another diode in a direction of the second surface 119 of the first electrode 110.

The non-volatile memory device according to example embodiments may form a pair of memory cells. The first electrode 110 may be used as a common bit line, and the second electrodes 150 may be used as word lines. Accordingly, the non-volatile memory device may process data in units of 2 bits by using the pair of data storage layers 130.

Figure 3:
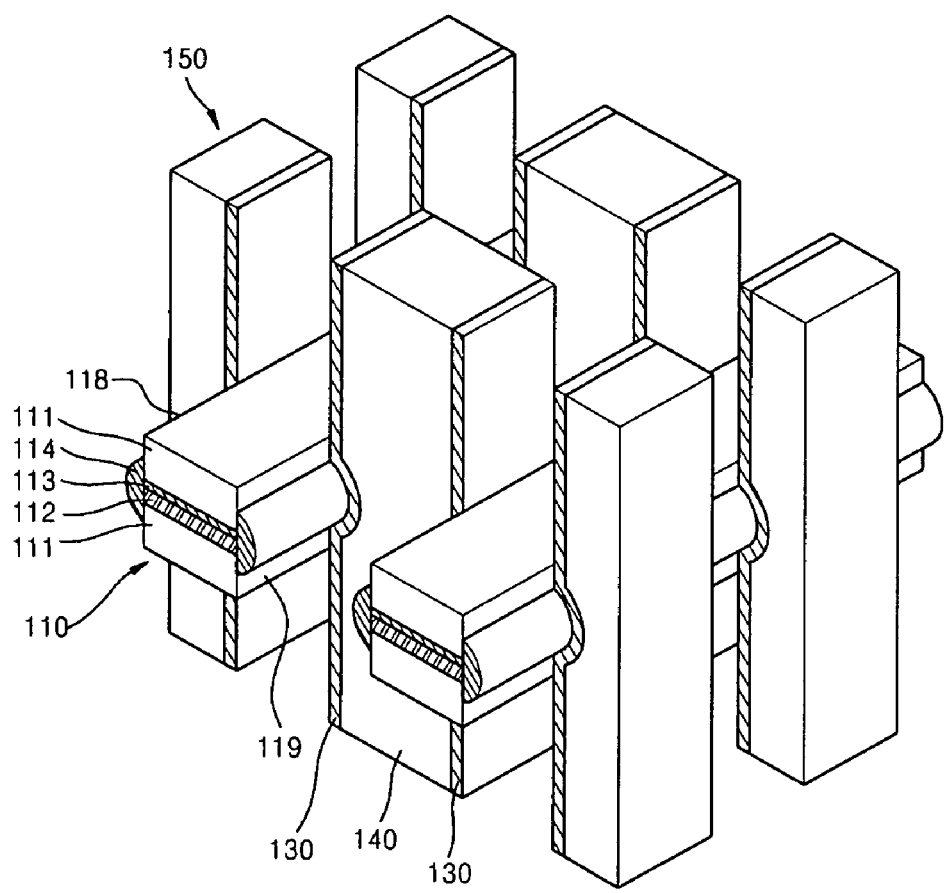
FIG. 3 is a perspective view illustrating a non-volatile memory device according to example embodiments.

FIG. 3 is a perspective view illustrating a non-volatile memory device according to example embodiments. The non-volatile memory device according to example embodiments may have the array structure of the non-volatile memory device of FIG. 2, and thus descriptions of the same elements will be omitted.

Referring to FIG. 3, a plurality of the first electrodes 110 may be disposed on the same plane, and a plurality of the second electrodes 150 may cross the first electrodes 110. For example, a plurality of pairs of the second electrodes 150 may be spaced apart from both sides of the first electrodes 110 along each extension direction of the first electrodes 110. That is, a plurality of pairs of second electrodes 150 may be disposed on both sides of the first electrodes 110, wherein the pair of second electrodes 150 may be spaced apart from each other in a direction parallel to a direction in which the first electrode 110 extends. The second electrodes 150 between the first electrodes 110 may be shared by memory cells on both sides of the second electrodes 150. Also, a plurality of pairs of the data storage layers 130 may be spaced apart from each of the both sides of the first electrodes 110 along each extension direction of the first electrodes 110.

The plurality of data storage layers 130 may be disposed between the first electrodes 110 and the second electrodes 150. A plurality of diodes may be formed on each of the first surface 118 and the second surface 119 of the first electrodes 110.

Figure 4:
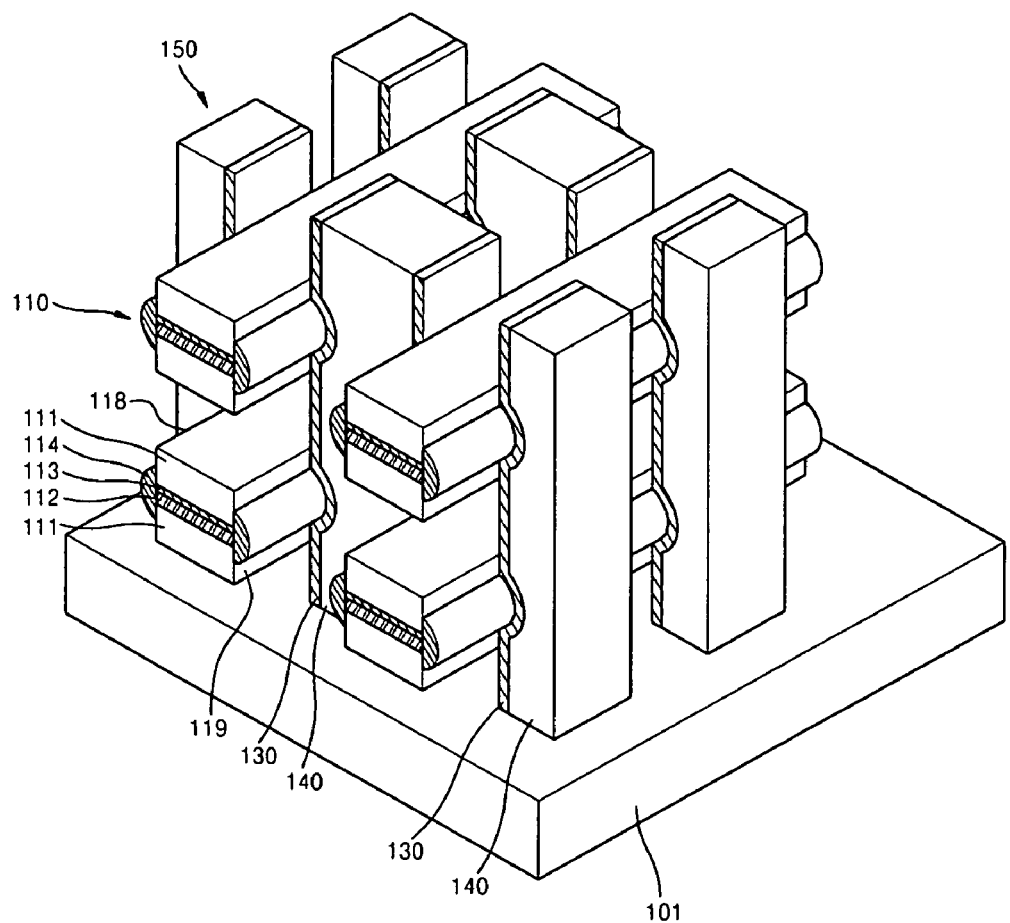
FIG. 4 is a perspective view illustrating a non-volatile memory device according to example embodiments.

FIG. 4 is a perspective view illustrating a non-volatile memory device according to example embodiments. The non-volatile memory device according to example embodiments illustrated in FIG. 4 may correspond to a stacked structure of the non-volatile memory device of FIG. 3, and thus descriptions of the same elements will be omitted.

Referring to FIG. 4, a plurality of the first electrodes 110 may be stacked in a plurality of layers. A plurality of the second electrodes 150 may perpendicularly cross the stacked first electrodes 110. For example, a plurality of pairs of the second electrodes 150 may be spaced apart from both sides of the stacked first electrodes 110 along extension directions of the first electrodes 110. Each second electrode 150 extends crossing the first electrodes 110 so as to be shared by memory cells disposed along the stacked first electrodes 110. For example, the first electrodes 110 and the second electrodes 150 may perpendicularly cross each other.

A plurality of the data storage layers 130 may be disposed on sections where the first electrodes 110 and the second electrodes cross each other. The first electrode 110, the data storage layer 130, and the second electrode 150 may form a diode. A plurality of pairs of diodes may be formed on each first surface 118 and the second surface 119 of the first electrodes 110.

According to the non-volatile memory device according to example embodiments, a plurality of memory cells may be disposed in a 3-dimensional structure. A number of memory cells may be easily adjusted by adjusting a number and length of the first and second electrodes 110 and 150. Accordingly, the non-volatile memory device may be easily highly integrated, and as a result, suitable for a high capacity product.

According to a structure of a non-volatile memory device, the first electrode 110 may extend in a longitudinal direction. In example embodiments, the electric resistance of the first electrode 110 increases, and thus, may cause an undesirable result in operating the non-volatile memory device. However, the non-volatile memory device according to example embodiments may include the first conductive layer 112 having a resistivity lower than that of the first semiconductor layer 114, and thus, electric resistance of the first electrode 110 may be decreased. Accordingly, the undesirable result in the non-volatile memory device in a multi-layer structure may be overcome.

In example embodiments, the number of the first electrodes 110, the second electrodes 150, and the data storage layers 130 are illustrated, and may be suitably adjusted according to the capacity of the non-volatile memory device. Selectively as illustrated in FIG. 4, the second electrodes 150 may be vertically extended on a substrate 101. However, example embodiments are not limited thereto, and the first electrodes 110 may be vertically extended on the substrate 101.

Figure 5:
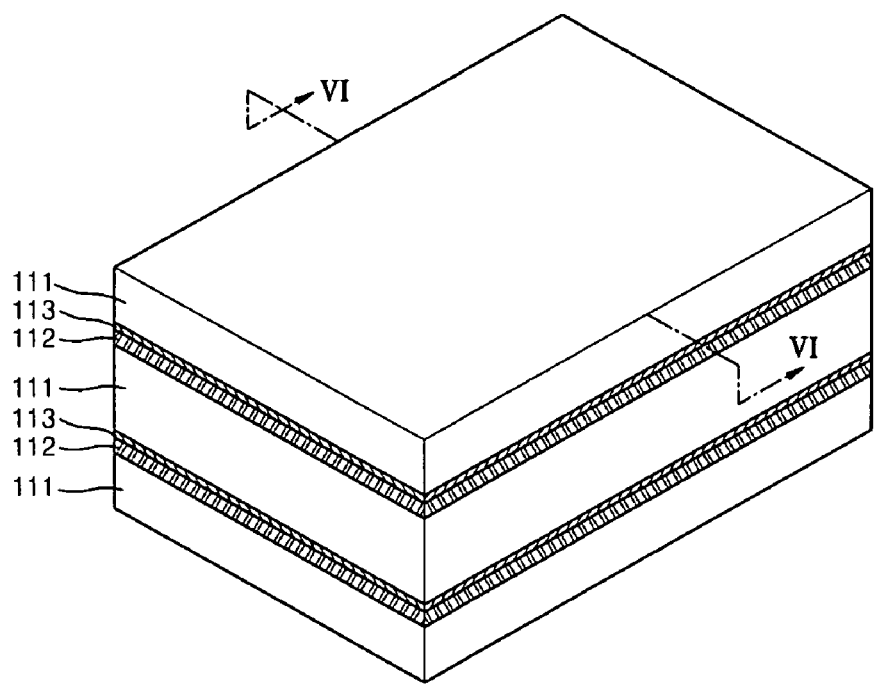
FIGS. 5, 7, 9, 11, 12, and 13 are perspective views for describing a method of fabricating a non-volatile memory device, according to example embodiments.
Figure 6:
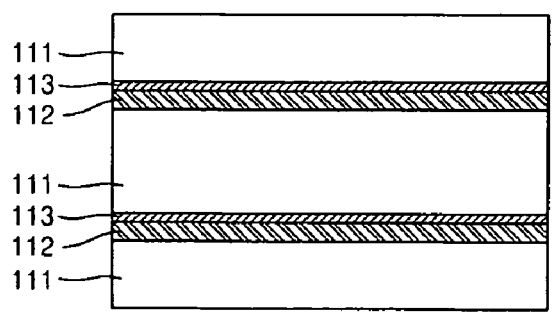
FIG. 6 is a cross-sectional view taken along a line VI-VI of the non-volatile memory device of FIG. 5.

FIGS. 5 through 15 are diagrams for describing a method of fabricating a non-volatile memory device, according to example embodiments. Referring to FIGS. 5 and 6, an initial stage of a stacked structure for forming first electrodes may be illustrated. First, the third semiconductor layer 113 having the first conductive type may be formed on the first conductive layer 112. The dielectric layer 111 may be further formed on top and bottom of the first conductive layer 112 and the third semiconductor layer 113 having the first conductive type. The dielectric layer 111 may be illustrated as one layer, but is not limited thereto. Accordingly, the dielectric layer 111 may include complex layers formed of various insulation materials. For example, a first dielectric layer (not shown), the first conductive layer 112, and the third semiconductor layer 113 having the first conductive type are sequentially stacked, patterned, and a second dielectric layer (not shown) may be filled between the pattern so as to form the structure of FIGS. 5 and 6.

A number of processes of repeatedly stacking the first conductive layer 112 and the third semiconductor layer 113 may be suitably determined according to a capacity of the non-volatile memory device, and the number of processes of repeatedly stacking the first conductive layer 112 and the third semiconductor layer 113 does not limit the scope of example embodiments. Accordingly, the number of processes of repeatedly stacking the first conductive layer 112 and the third semiconductor layer 113 may be one or more.

Figure 7:
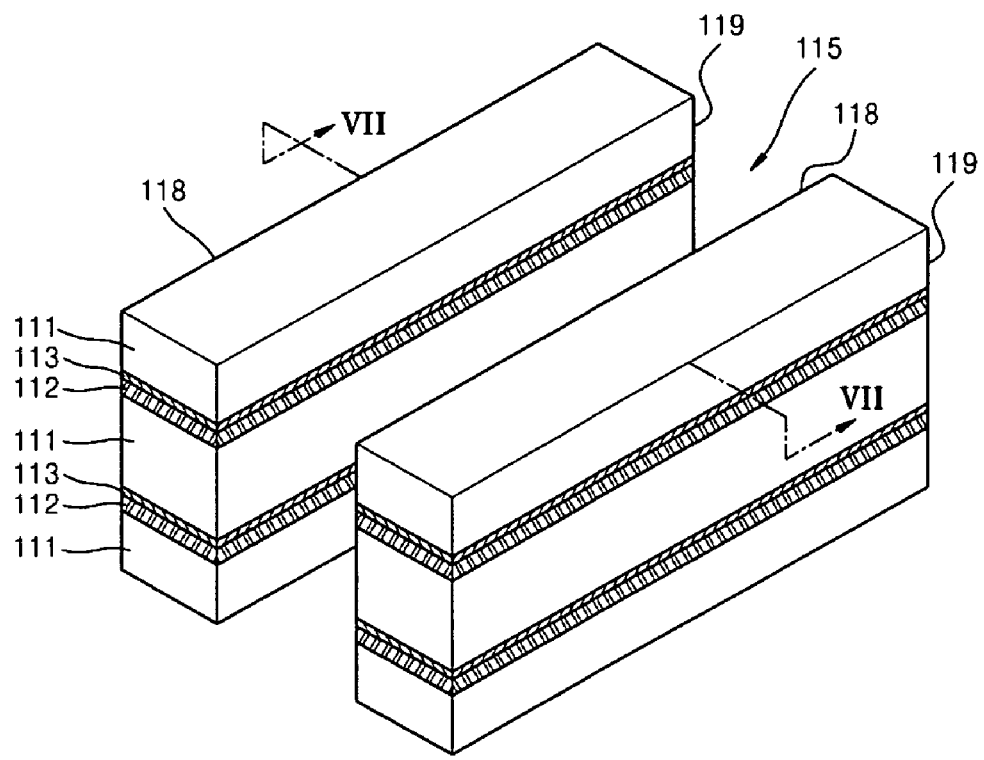
Figure 8:
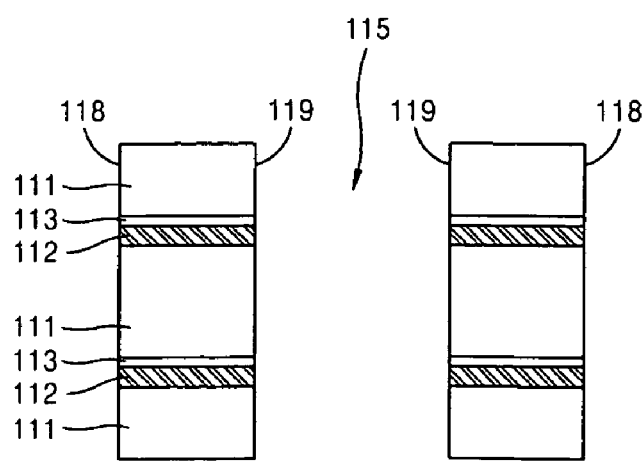
FIG. 8 is a cross-sectional view taken along a line VII-VII of the non-volatile memory device of FIG. 7.

Referring to FIGS. 7 and 8, trenches 115 may be formed to expose the first surface 118 and/or the second surface 119 of the first conductive layer 112 and the third semiconductor layer 113. For example, the trenches 115 may be formed via a photolithography and etching technology.

Figure 9:
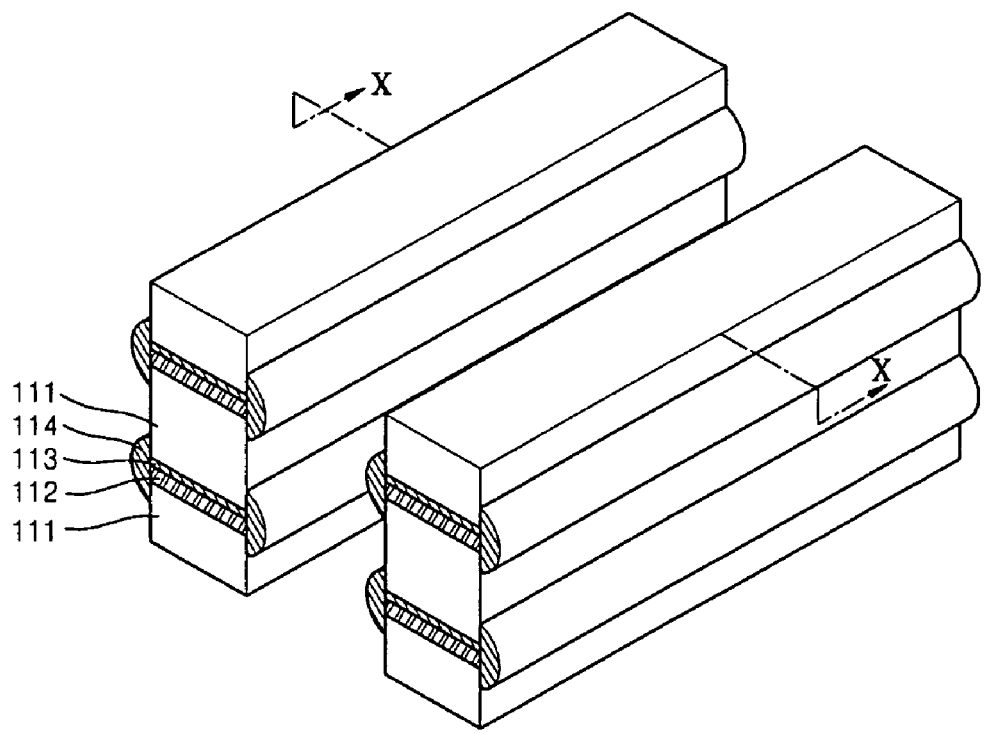
Figure 10:
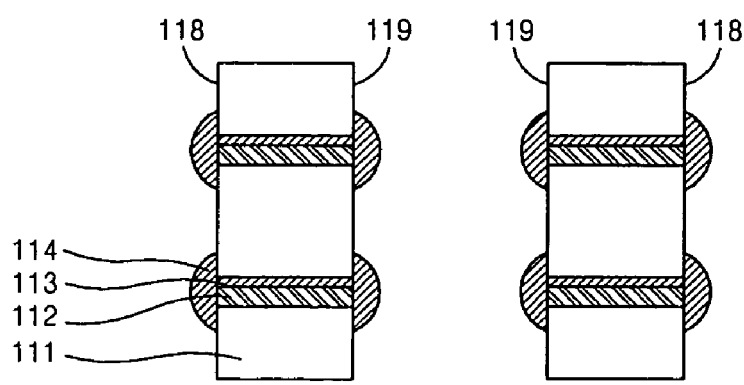
FIG. 10 is a cross-sectional view taken along a line X-X of the non-volatile memory device of FIG. 9.

Referring to FIGS. 9 and 10, the first semiconductor layer 114 may be selectively grown from a side of the third semiconductor layer 113 having the first conductive type. The side of the third semiconductor layer 113 denotes a surface of the third semiconductor layer 113 exposed from the first and second surfaces 118 and 119. The selectively grown first semiconductor layer 114 may be of the first conductive type, and may be formed to cover a side of the first conductive layer 112. Accordingly, the semiconductor layer 113 may operate as a seed layer for growing the first semiconductor layer 114.

Technologies for selectively growing the first semiconductor layer 114 of the first conductive type include depositing and patterning a first seed layer of polysilicon and selectively growing this layer in an epitaxial reactor, and are described in further detail, for example, in the article "Micro-Electro-Mechanical Systems Fast Fabrication by Selective Thick Polysilicon Growth in Epitaxial Reactor" disclosed in Microsystem Technology [12], 953 (2006).

Figure 11:
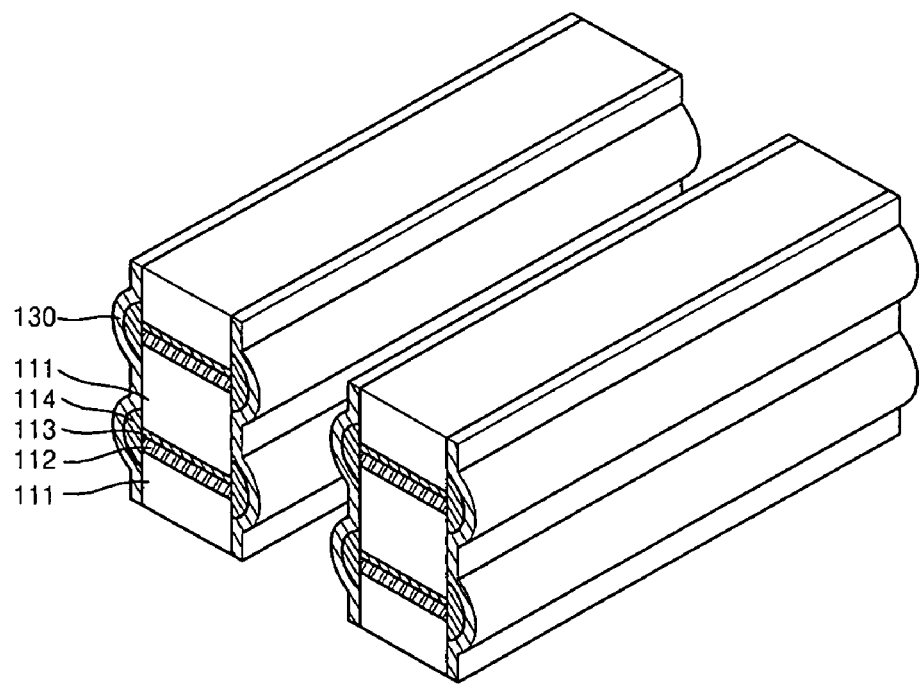

Referring to FIG. 11, the data storage layers 130 may be formed on the first surface and the second surface 119, which are the structure of FIG. 10. The data storage layers 130 are illustrated as layers perpendicularly continuing on the first surface 118 and the second surface 119, but may be disposed on sections where the first electrodes 110 and the second electrodes 150 cross each other. The data storage layer 130 may be formed via a deposition process.

Figure 12:
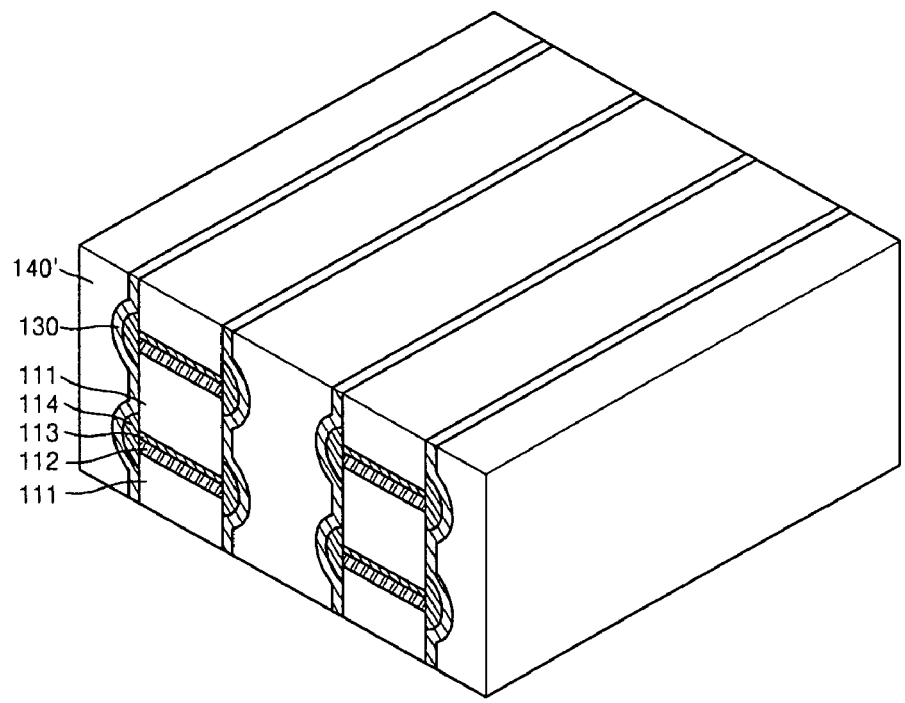

Referring to FIG. 12, after forming the data storage layer 130, a trench area limited by the data storage layer 130 may be filled with a second conductive layer 140' of the second conductive type that is opposite to the first conductive type.

Figure 13:
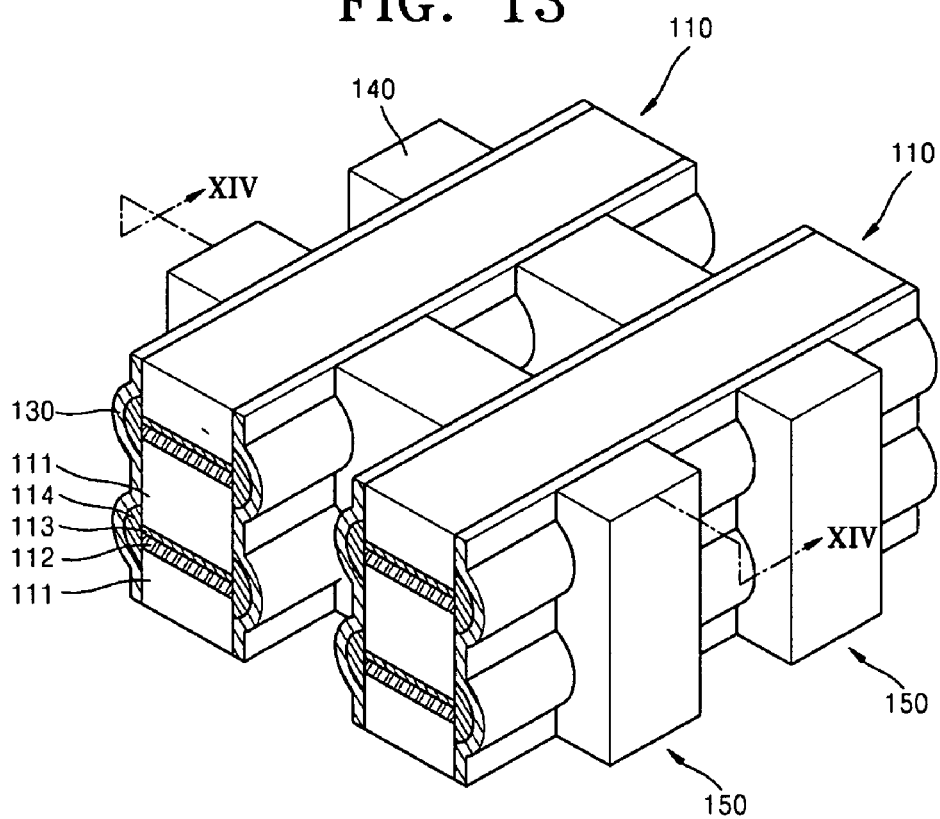
Figure 14:
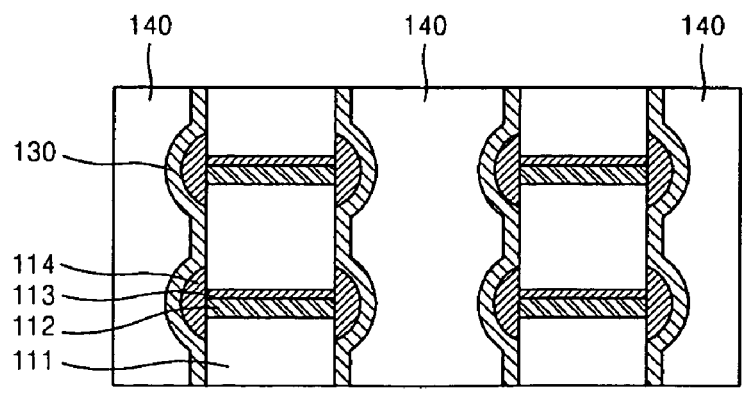
FIG. 14 is a cross-sectional view taken along a line XIV-XIV of the non-volatile memory device of FIG. 13.

Referring to FIGS. 13 and 14, the second conductive layer 140' of the second conductive type may be patterned in a shape of the second electrode 150. A number of the second electrodes 150 may be suitably determined according to capacity of the non-volatile memory device, and does not limit the scope of example embodiments. For example, the second electrodes 150 may be provided on one side of the first electrodes 110 or on both sides of the first electrodes 110 as a pair.

Figure 15:
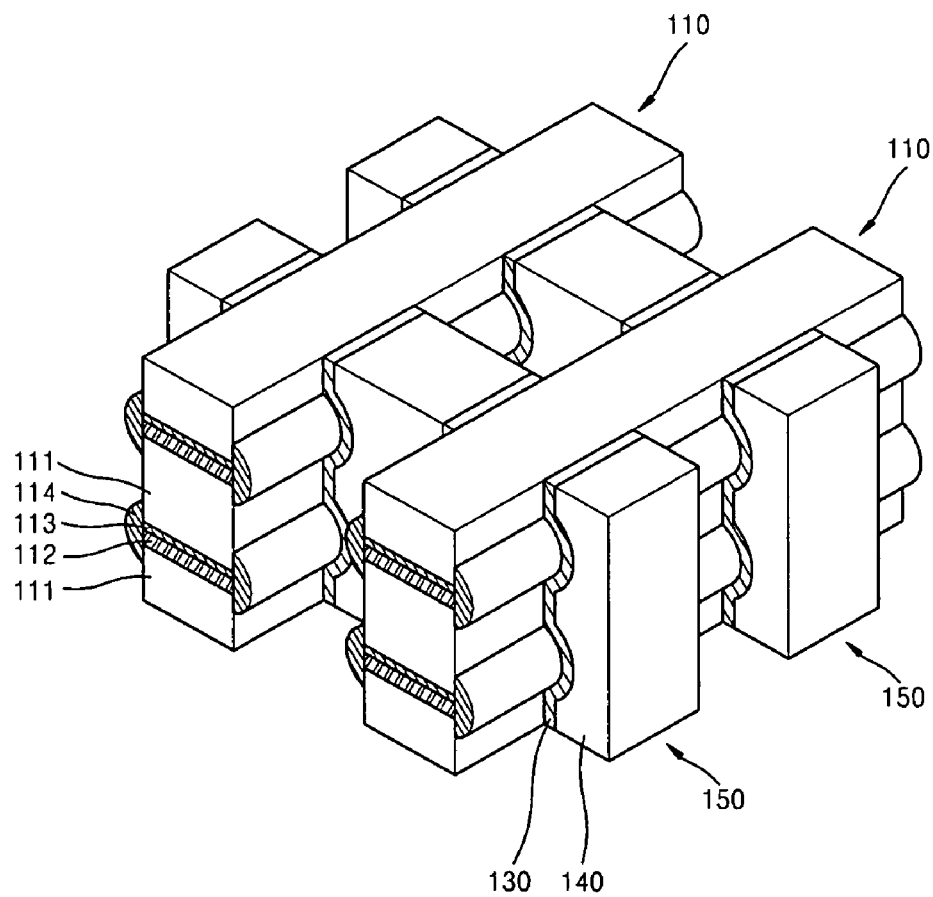
FIG. 15 is a perspective view illustrating a non-volatile memory device according to example embodiments.

The data storage layers 130 may be disposed between the first electrodes 110 and the second electrodes 150 that cross each other. In FIG. 13, the data storage layers 130 are illustrated as layers continuous on the entire surfaces of the first and second surfaces 118 and 119 of FIG. 10. The second electrodes 150 may include second semiconductor layers 140 of a second conductive type opposite to the first conductive type. However, as illustrated in FIG. 15, the data storage layers 130 may be disposed on sections where the first electrodes 110 and the second electrodes 150 cross each other. According to the method of fabricating the non-volatile memory device described above, the non-volatile memory device having a stacked structure may be economically fabricated at once.

Figure 16:
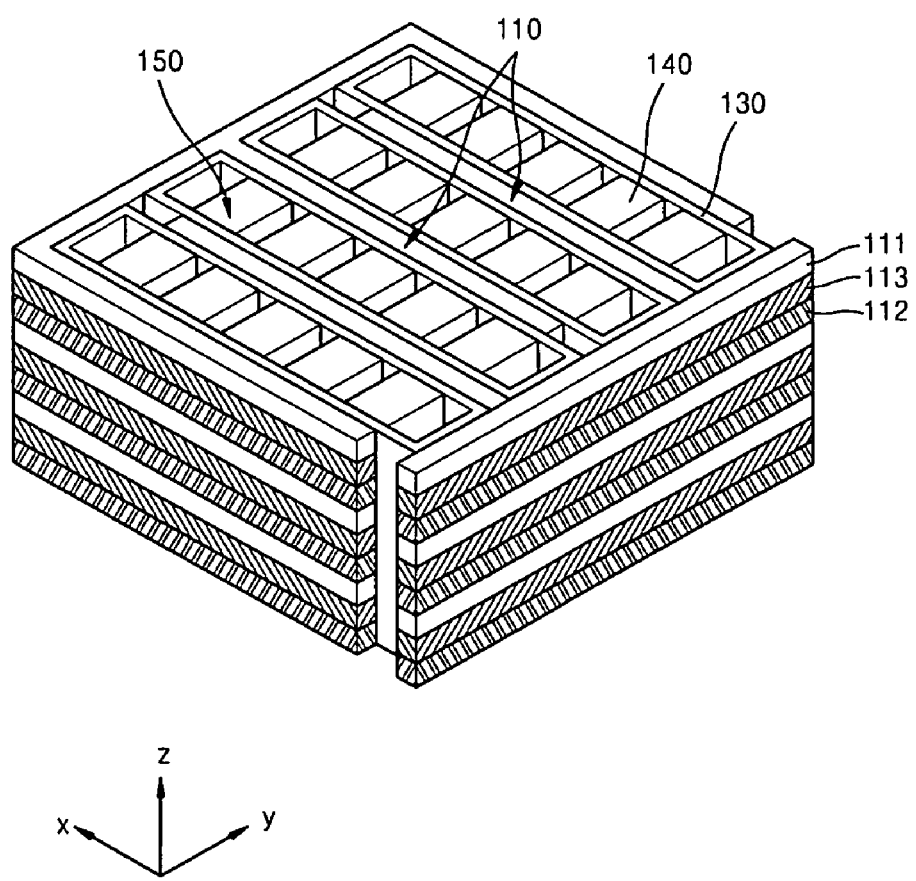
FIG. 16 is a perspective view illustrating a stacked structure of a non-volatile memory device, according to example embodiments.

FIG. 16 is a perspective view illustrating a stacked structure of a non-volatile memory device, according to example embodiments. Referring to FIG. 16, a plurality of the second electrodes 150 extends in a z-direction in a pillar shape. At least one pair of the first electrodes 110 are each disposed on one and another sides of the second electrode 150 and extend in an x-direction. The at least one pair of the first electrodes 110 may be extended in parallel to each other. However, such an arrangement is just an example. For example, the at least one pair of the first electrodes 110 disposed on the one and other sides of the second electrodes 150 may not be parallel but do not contact each other. The data storage layer 130 may be disposed between the first and second electrodes 110 and 150. The second electrodes 150 may include second semiconductor layers 140 of a second conductive type opposite to the first conductive type. The first electrodes 110 may have a structure wherein a stacked structure of the first conductive layer 112, the third semiconductor layer 113 of the first conductive type, and the dielectric layer 111 is repeated at least once.

In the non-volatile memory device, the first electrodes 110 may be used as a part of a word line and the second electrodes 150 may be used as a part of a bit line. Accordingly, the non-volatile memory device may be a memory cell sharing a bit line, e.g., the second electrodes 150.

When a longitudinal direction (x-direction) of the first electrode 110 is designed to be relatively longer than a longitudinal direction (z-direction) of the second electrodes 150, resistance of the first electrodes 110 increases, and thus, a number of memory cells per line may be restricted. However, according to the non-volatile memory device, the first electrodes 110 may include the first conductive layer 112 including a metal layer and/or a silicide layer, and thus, an increase of the resistance of the first electrodes 110 may be suppressed.

Figure 17:
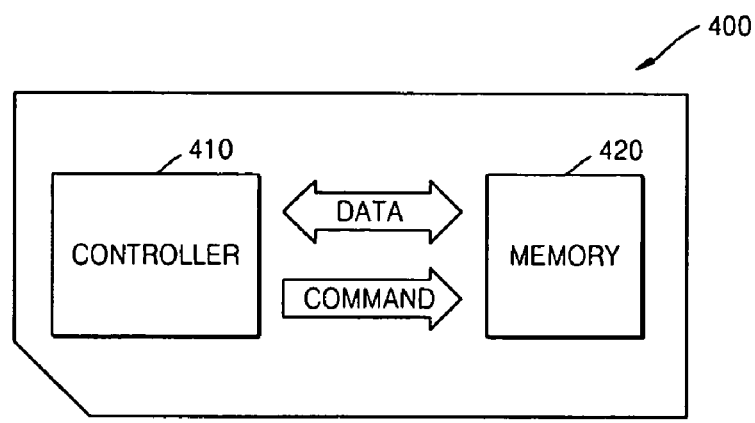
FIG. 17 is a conceptual diagram illustrating a card according to example embodiments.

FIG. 17 is a conceptual diagram illustrating a card 400 according to example embodiments. Referring to FIG. 17, a controller 410 and a memory 420 may be disposed to exchange electric signals. For example, the memory 420 and the controller 410 may exchange data according to a command of the controller 410. Accordingly, the card 400 may store data in the memory 420 and externally output data from the memory 420.

The memory 420 may include the non-volatile memory device described with reference to FIGS. 1 through 16. The type of the non-volatile memory device is not limited, and the non-volatile memory device may be a DRAM, SRAM, a flash memory, or a phase change RAM (PRAM). The card 400 may be used in various portable electric devices, for example, a multi media card (MMC) and a secure digital (SD) card.

Figure 18:
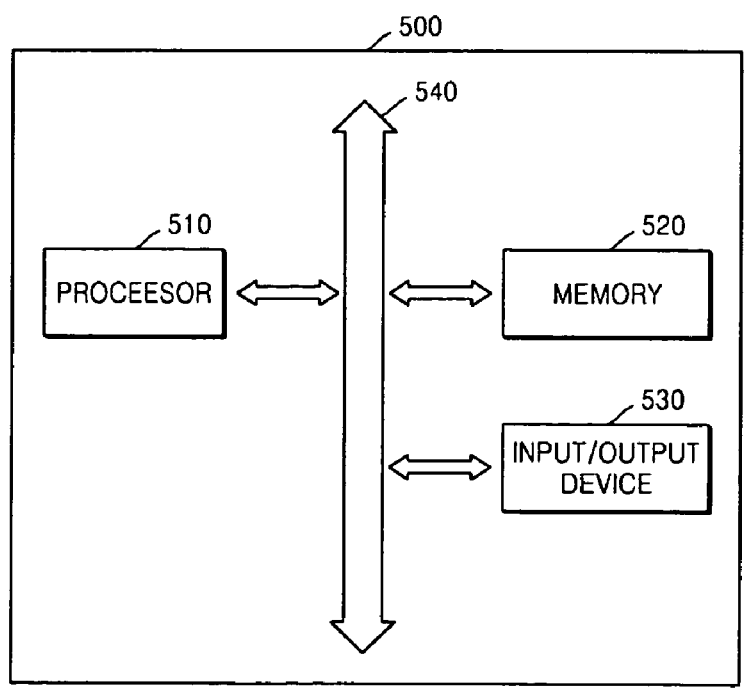
FIG. 18 is a conceptual diagram illustrating a system according to example embodiments.

FIG. 18 is a conceptual diagram illustrating a system 500 according to example embodiments. Referring to FIG. 18, a processor 510, an input/output device 530, and a memory 520 may transmit/receive data to/from each other by using a bus 540. The processor 510 may execute a program and may control the system 500. The input/output device 530 may be used to input or output data of the system 500. The system 500 may be connected to an external apparatus, e.g., a personal computer or a network, by using the input/output device 530 so as to exchange data with the external apparatus.

The memory 520 may store codes and data for operating the processor 510. The memory 520 may include the non-volatile memory device described with reference to FIGS. 1 through 16. The type of the non-volatile memory device is not limited, and the non-volatile memory device may be a DRAM, SRAM, a flash memory, or a PRAM. For example, the system 500 may be used in various portable electric devices, e.g., a mobile phone, an MP3 player, a navigation system, a solid state disk (SSD), and household appliances.

Figure 19:
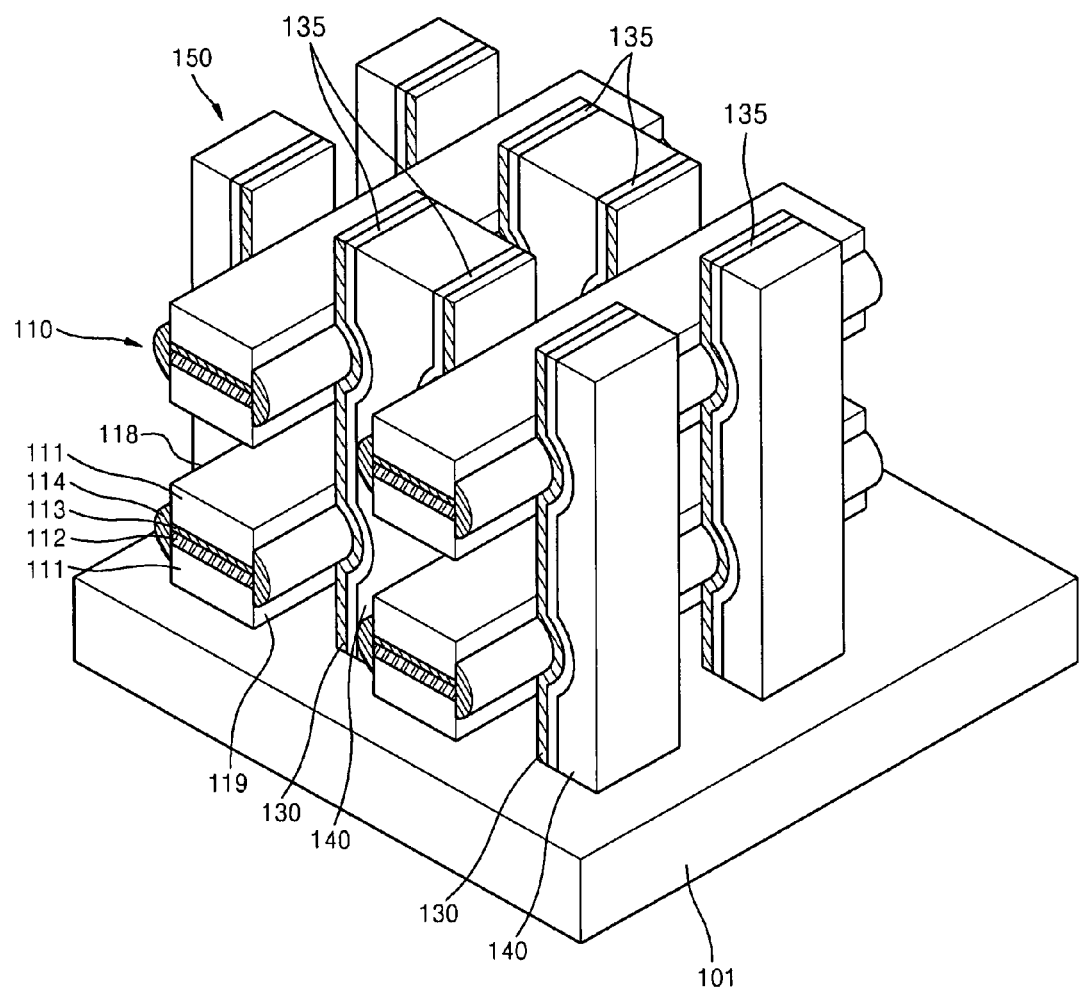
FIG. 19 is a perspective view illustrating a non-volatile memory device according to example embodiments.

FIG. 19 is a perspective view illustrating a non-volatile memory device according to example embodiments. Referring to FIG. 4, a plurality of the first electrodes 110 may be stacked in a plurality of layers. A plurality of the second electrodes 150 may perpendicularly cross the stacked first electrodes 110. For example, a plurality of pairs of the second electrodes 150 may be spaced apart from both sides of the stacked first electrodes 110 along extension directions of the first electrodes 110. Each second electrode 150 extends crossing the first electrodes 110 so as to be shared by memory cells disposed along the stacked first electrodes 110. For example, the first electrodes 110 and the second electrodes 150 may perpendicularly cross each other.

A plurality of the data storage layers 130 may be disposed on sections where the first electrodes 110 and the second electrodes cross each other. The first electrode 110, the data storage layer 130, and the second electrode 150 may form a diode. A plurality of pairs of diodes may be formed on each first surface 118 and the second surface 119 of the first electrodes 110.

According to the non-volatile memory device according to example embodiments, a plurality of memory cells may be disposed in a 3-dimensional structure. A number of memory cells may be easily adjusted by adjusting a number and length of the first and second electrodes 110 and 150. Accordingly, the non-volatile memory device may be easily highly integrated, and as a result, suitable for a high capacity product.

According to a structure of a non-volatile memory device, the first electrode 110 may extend in a longitudinal direction. In example embodiments, the electric resistance of the first electrode 110 increases, and thus, may cause an undesirable result in operating the non-volatile memory device. However, the non-volatile memory device according to example embodiments may include the first conductive layer 112 having a resistivity lower than that of the first semiconductor layer 114, and thus, electric resistance of the first electrode 110 may be decreased. Accordingly, the undesirable result in the non-volatile memory device in a multi-layer structure may be overcome.

In example embodiments, the number of the first electrodes 110, the second electrodes 150, and the data storage layers 130 are illustrated, and may be suitably adjusted according to the capacity of the non-volatile memory device. Selectively as illustrated in FIG. 4, the second electrodes 150 may be vertically extended on a substrate 101. However, example embodiments are not limited thereto, and the first electrodes 110 may be vertically extended on the substrate 101. The second electrode 150 may further include a second conductive layer 135 like the first electrode 110. The second conductive layer 135 has a resistivity lower than that of the second semiconductor layer 140.

While the inventive concept has been particularly shown and described with reference to example embodiments thereof, it will be understood that various changes in form and details may be made therein without departing from the spirit and scope of the following claims.

What is claimed is:

1. A non-volatile memory device comprising:
   at least one first electrode including at least one first semiconductor layer of a first conductive type and at least one first conductive layer having a resistivity lower than a resistivity of the at least one first semiconductor layer;
   at least one second electrode including at least one second semiconductor layer of a second conductive type that is opposite of the first conductive type and crosses the at least one first electrode; and
   at least one data storage layer on a section where the at least one first semiconductor layer of the at least one first electrode and the at least one second semiconductor layer of the at least one second electrode cross each other.

2. The non-volatile memory device of claim 1, wherein the at least one first conductive layer is a metal layer, a metal silicide layer, or a multi-layer including a metal layer and a metal silicide layer.

3. The non-volatile memory device of claim 1, wherein the at least one first electrode and the at least one second electrode perpendicularly cross each other.

4. The non-volatile memory device of claim 1, wherein the at least one first semiconductor layer is between the at least one first conductive layer and the at least one data storage layer so that the at least one first conductive layer and the at least one data storage layer do not directly contact each other.

5. The non-volatile memory device of claim 4, wherein the at least one first semiconductor layer is between the at least one first conductive layer and the at least one data storage layer so as to cover a side surface of the at least one first conductive layer facing the at least one data storage layer.

6. The non-volatile memory device of claim 5, wherein the at least one first semiconductor layer has a first surface facing the at least one data storage layer, and a section of the first surface forms a convex arc.

7. The non-volatile memory device of claim 1, wherein the at least one first electrode further comprises at least one third semiconductor layer of the first conductive type on the at least one first conductive layer.

8. The non-volatile memory device of claim 7, wherein the at least one first semiconductor layer is between the at least one third semiconductor layer and the at least one data storage layer and between the at least one first conductive layer and the at least one data storage layer so as to cover a side surface of the at least one third semiconductor layer facing the at least one data storage layer and a side surface of the at least one first conductive layer facing the at least one data storage layer.

9. The non-volatile memory device of claim 1, wherein the at least one data storage layer comprises a material for storing a resistance change thereof.

10. The non-volatile memory device of claim 1, wherein the at least one second electrode further comprises at least one second conductive layer having a resistivity lower than a resistivity of the at least one second semiconductor layer.

11. The non-volatile memory device of claim 1, wherein the at least one second electrode includes at least one pair of second electrodes on both sides of the at least one first electrode.

12. The non-volatile memory device of claim 11, wherein the at least one first electrode has a first surface and a second surface facing the at least one pair of second electrodes, and the at least one data storage layer comprises at least one pair of data storage layers on the first surface and the second surface.

13. The non-volatile memory device of claim 12, wherein the at least one pair of second electrodes includes a plurality of pairs of second electrodes along an extension direction of the at least one first electrode, and
the at least one pair of data storage layers includes a plurality of pairs of data storage layers along the extension direction of the at least one first electrode.

14. The non-volatile memory device of claim 13, wherein the at least one first electrode comprises a plurality of first electrodes in a plurality of layers.

15. The non-volatile memory device of claim 1, wherein at least one of the at least one first electrode and the at least one second electrode is perpendicularly disposed on a substrate.

16. The non-volatile memory device of claim 1, wherein the at least one second electrode contacts a sidewall of the at least one first electrode.

17. The non-volatile memory device of claim 1, further comprising:
at least one dielectric layer on exposed surfaces of the at least one first conductive layer and the at least one first semiconductor layer,
wherein the at least one dielectric layer is made of a silicon oxide layer.

18. The non-volatile memory device of claim 1, wherein the at least one first electrode, the at least one data storage layer, and the at least one second electrode form a diode.

19. A card comprising:
a controller; and
a memory including the non-volatile memory device according to claim 1,
wherein the controller and the memory are configured to exchange electric signals according to a command of the controller.

20. A system comprising:
a processor;
an input/output device; and
a memory including the non-volatile memory device according to claim 1,
wherein the processor, the input/output device, and the memory are configured to transmit or receive data to/from each other via a bus.

* * * * *